United States Patent [19]

Chu et al.

[11] Patent Number: 5,567,271

[45] Date of Patent: Oct. 22, 1996

[54] OXYGEN REACTIVE ION ETCH (RIE) PLASMA METHOD FOR REMOVING OXIDIZED ORGANIC RESIDUES FROM SEMICONDUCTOR SUBSTRATES

[75] Inventors: Ron F. Chu; Chet P. Lim; Sheau-Tan Loong, all of Singapore, Singapore

[73] Assignee: Chartered Semiconductor Manufacturing Pte Ltd, Singapore, Singapore

[21] Appl. No.: 507,531

[22] Filed: Jul. 26, 1995

[51] Int. Cl.$^6$ ................................ H01L 21/311
[52] U.S. Cl. .................. 156/659.11; 216/62; 216/63; 134/1.2; 156/643.1
[58] Field of Search ................ 216/63, 64, 67, 216/49, 62; 134/1.1, 1.2; 156/643.1, 651.1, 659.11

[56] References Cited

U.S. PATENT DOCUMENTS

| | | | |
|---|---|---|---|
| 4,980,022 | 12/1990 | Fujimura et al. | 156/643 |
| 5,057,187 | 10/1991 | Shinagawa et al. | 156/643 |
| 5,135,608 | 8/1992 | Okutami | 156/643 |
| 5,315,312 | 5/1994 | DiBanto et al. | 345/107 |
| 5,382,316 | 1/1995 | Hills et al. | 156/643 |
| 5,397,432 | 3/1995 | Konno et al. | 156/643 |

FOREIGN PATENT DOCUMENTS

| | | |
|---|---|---|
| 03110843 | 5/1991 | Japan . |
| 9207337 | 8/1992 | Rep. of Korea . |

*Primary Examiner*—R. Bruce Breneman
*Assistant Examiner*—George Goudreau
*Attorney, Agent, or Firm*—George O. Saile; Alek P. Szecsy

[57] ABSTRACT

A Reactive Ion Etch (RIE) plasma method for removing from semiconductor substrates oxidized organic residues such as oxidized photoresist residues, and the Reactive Ion Etch (RIE) plasma which is employed within the Reactive Ion Etch (RIE) plasma method. A semiconductor substrate upon whose surface resides an oxidized organic residue such as an oxidized photoresist residue is provided into a Reactive Ion Etch (RIE) plasma chamber. Also provided into the chamber is a concentration of oxygen and a concentration of moisture. Finally, a radio frequency excitation of sufficient magnitude is provided to the concentration of oxygen and the concentration of moisture to form a plasma. The oxidized organic residue which resides upon the semiconductor substrate is then removed through etching in the Reactive Ion Etch (RIE) plasma. The concentration of moisture may be introduced into the Reactive Ion Etch (RIE) chamber through desorbtion of moisture within and upon the surface of an oxidized photoresist residue residing upon a semiconductor substrate.

14 Claims, 2 Drawing Sheets

OXYGEN REACTIVE ION ETCH (RIE) PLASMA METHOD FOR REMOVING OXIDIZED ORGANIC RESIDUES FROM SEMICONDUCTOR SUBSTRATES

BACKGROUND OF THE INVENTION

1. Field of the Invention

The present invention relates generally to oxygen Reactive Ion Etch (RIE) plasma methods for removing organic residues from semiconductor substrates. More particularly, the present invention relates to an improved oxygen Reactive Ion Etch (RIE) plasma method which includes non-explosive hydrogen containing species within the plasma, which improved oxygen plasma method is useful in removing from semiconductor substrates oxidized organic residues such as oxidized photoresist residues.

2. Description of the Background Art

Advanced semiconductor integrated circuit device chips are typically manufactured through processes which provide multiple conductive layers and multiple insulating layers upon a plurality of active semiconductor substrate regions. These layers and regions are typically defined and formed through etching and masking processes which involve the photolithographic exposure and developing of blanket photoresist layers. Commonly, a photolithographically exposed blanket photoresist layer will be developed into a patterned photoresist layer through which features to be formed within or upon a semiconductor substrate are defined.

Subsequent to photolithographic exposure and development, patterned photoresist layers which remain upon a semiconductor substrate may be exposed to semiconductor manufacturing processes which significantly alter the chemical or physical structure of those patterned photoresist layers. Such manufacturing processes may include: (1) implanting of high doses of dopant species into those patterned photoresist layers, (2) exposure of those patterned photoresist layers to substantial quantities of radiative energy, or (3) exposure of those patterned photoresist layers to elevated temperatures. Each of these manufacturing processes may produce changes in patterned photoresist layers which yield substantial concentrations of oxidized species within those patterned photoresist layers.

Typically, patterned photoresist layers are removed prior to forming over-lying layers of the semiconductor structure within which those patterned photoresist layers were formed. Commonly, patterned photoresist layers are removed from the semiconductor substrates upon which they were formed through exposure of the patterned photoresist layers to an oxygen Reactive Ion Etch (RIE) plasma. However, patterned photoresist layers which contain substantial quantities of oxidized species may be difficult to remove from semiconductor substrates through oxygen Reactive Ion Etch (RIE) plasma processes since oxidized species within patterned photoresist layers are often unaffected by the chemical and physical effects of oxygen Reactive Ion Etch (RIE) plasmas.

Thus, it is often necessary to include into such oxygen Reactive Ion Etch (RIE) plasmas a reducing material which may react effectively with the oxidized species contained within the oxidized patterned photoresist layer. The most common reducing material which may be incorporated into an oxygen Reactive Ion Etch (RIE) plasma to assist in removal of oxidized species within patterned photoresist layers is hydrogen gas. Hydrogen gas is typically incorporated into those oxygen Reactive Ion Etch (RIE) plasmas in the form of forming gas mixtures such as nitrogen/hydrogen mixtures and helium/hydrogen mixtures.

While oxygen Reactive Ion Etch (RIE) processes which contain reducing materials such as hydrogen gas are usually quite effective in removing oxidized organic residues such as oxidized photoresist residues from semiconductor substrates, such Reactive Ion Etch (RIE) plasmas are not without problems. In particular hydrogen gas containing reducing materials when used within oxygen Reactive Ion Etch (RIE) plasmas are typically expensive in comparison with other materials used within those Reactive Ion Etch (RIE) plasmas. In addition, hydrogen gas mixtures when provided into an oxygen Reactive Ion Etch (RIE) plasma also possess an inherent safety concern related to the explosive characteristics of hydrogen gas in ambient atmospheres containing oxygen.

Therefore, although it is desirable to provide an oxygen Reactive Ion Etch (RIE) plasma containing a sufficient quantity of reducing material to effectively remove oxidized organic residues such as oxidized photoresist residues from semiconductor substrates, it is also desirable that the reducing material incorporated into that oxygen Reactive Ion Etch (RIE) plasma provide a plasma which is both economical and safe to use in a manufacturing environment. It is towards these two goals that the present invention is directed.

SUMMARY OF THE INVENTION

A first object of the present invention is to provide an oxygen Reactive Ion Etch (RIE) plasma which contains a sufficient quantity of reducing material to effectively yet safely remove oxidized organic residues such as oxidized photoresist residues from semiconductor substrate surfaces.

A second object of the present invention is to provide an oxygen Reactive Ion Etch (RIE) plasma in accord with the first object of the present invention, which oxygen Reactive Ion Etch (RIE) plasma is also economical for use within a manufacturing environment.

In accord with the objects of the present invention a new oxygen Reactive Ion Etch (RIE) plasma and its method for use in removing from semiconductor substrates oxidized organic residues such as oxidized photoresist residues is disclosed. The method for using the oxygen Reactive Ion Etch (RIE) plasma of the present invention begins with providing into a reaction chamber a semiconductor substrate upon whose surface resides an oxidized organic residue such as an oxidized photoresist residue. A concentration of oxygen and a concentration of moisture are then provided into the reaction chamber. A radio frequency excitation of sufficient magnitude to form a plasma is then provided to the concentration of oxygen and the concentration of moisture. The semiconductor substrate is then etched within the plasma formed from the concentration of oxygen and the concentration of moisture until the oxidized organic residue is removed.

The oxygen Reactive Ion Etch (RIE) plasma of the present invention is effective in removing oxidized organic residues such as oxidized photoresist residues from semiconductor substrates. The oxygen Reactive Ion Etch (RIE) plasma of the present invention possesses sufficient quantities of reducing species formed from the moisture within the plasma to reduce oxidized organic residues such as oxidized photoresist residues to volatile species which may be removed from the semiconductor substrates upon which those oxidized organic residues reside.

The oxygen plasma of the present invention is safe. The oxygen Reactive Ion Etch (RIE) plasma of the present invention employs moisture as the source of hydrogen containing reducing species which are used to react with oxidized organic residues such as oxidized photoresist residues. The oxygen plasma of the present invention does not use hydrogen, or forming gas mixtures containing hydrogen, which hydrogen or forming gas mixtures have a tendency towards explosion in ambient atmospheres containing oxygen.

The oxygen plasma of the present invention is economical. Since the oxygen plasma of the present invention uses moisture as the source of reducing species rather than hydrogen or forming gas mixtures, the costs associated with the material from which is formed reducing species is low. In addition, costs associated with delivering the reducing material moisture to the reaction chamber in which is contained the semiconductor substrate upon whose surface resides the oxidized organic residue are lower than the costs associated with delivering the reducing material hydrogen or forming gas to the same reaction chamber.

The several methods through which the concentration of moisture may be provided into the reaction chamber in which is formed the improved oxygen Reactive Ion Etch (RIE) plasma of the present invention provide several embodiments of the present invention. Moisture may be provided into the reaction chamber through methods including but not limited to: (1) direct introduction of moisture, (2) co-introduction of moisture with oxygen, and (3) desorbtion of moisture from oxidized photoresist residues formed upon semiconductor substrates, which oxidized photoresist residues have previously been wetted with moisture. For the last method, the oxidized photoresist residue will typically comprise the oxidized organic residue to be removed by the oxygen Reactive Ion Etch (RIE) plasma of the present invention.

BRIEF DESCRIPTION OF THE DRAWINGS

The accompanying drawings, which form a material portion of the present disclosure, show the following.

DETAILED DESCRIPTION OF THE PREFERRED EMBODIMENTS

Figure 1A:
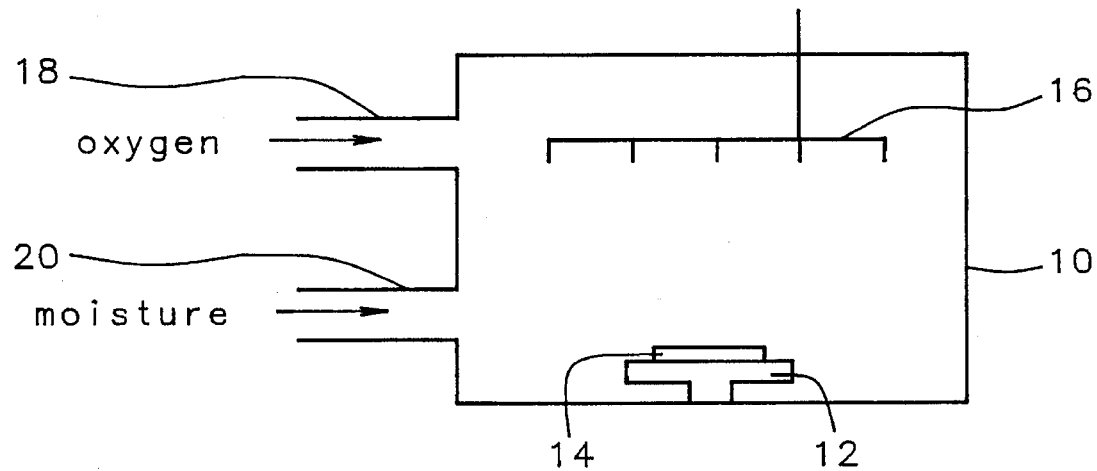
FIG. 1a to FIG. 1d show Reactive Ion Etch (RIE) reaction chambers into which are provided a concentration of oxygen and a concentration of moisture in accord with the preferred embodiments of forming the oxygen Reactive Ion Etch (RIE) plasma of the present invention.

The present invention provides an improved oxygen Reactive Ion Etch (RIE) plasma and a method by which that improved oxygen Reactive Ion Etch (RIE) plasma may be formed. The present invention provides an improved oxygen Reactive Ion Etch (RIE) plasma which contains reducing materials within the oxygen Reactive ion Etch (RIE) plasma, which reducing materials when excited through a radio frequency excitation provide reducing species which are useful in removing oxidized organic residues, such as oxidized photoresist residues, from semiconductor substrates. In comparison with conventional methods which employ hydrogen or forming gas mixtures as the source of reducing materials within oxygen plasmas which reduce oxidized organic residues such as oxidized photoresist residues, the present invention provides for the use of moisture as the source of reducing material. In comparison with the use of hydrogen or forming gas mixtures as the source of reducing materials, the use of moisture as the source of reducing material provides substantial advantages in economy and safety.

The present invention also provides a novel method by which moisture may be introduced into the oxygen Reactive Ion Etch (RIE) plasma of the present invention. The present invention discloses a method whereby moisture sorbed within the pores and upon the surface of an oxidized organic residue such as an oxidized photoresist residue may be desorbed to provide the source of reducing material moisture for the oxygen Reactive Ion Etch (RIE) plasma of the present invention. This method for providing the reducing material moisture into the oxygen Reactive Ion Etch (RIE) plasma of the present invention is particularly efficient and economical.

The method of the present invention may be employed in removing oxidized organic residues, such as oxidized photoresist residues, from semiconductor substrate surfaces of many varieties. The method of the present invention may be employed in removing oxidized organic residues such as oxidized photoresist residues from semiconductor substrates including but not limited to Dynamic Random Access Memory (DRAM) semiconductor substrates, Static Random Access Memory (SRAM) semiconductor substrates, semiconductor substrates upon which are formed field effect transistors and semiconductor substrates upon which are formed bipolar transistors. The method of the present invention has broad applicability in removing from semiconductor substrates oxidized organic residues such as oxidized photoresist residues.

The portion of the method of the present invention which involves desorbtion of moisture from oxidized photoresist residues previously wetted with deionized water also has broad applicability within semiconductor manufacture. There are several methods through which photoresists may be sufficiently oxidized such that moisture sorbed upon and within those oxidized photoresist residues may provide sufficient moisture upon desorbtion to practice the present invention.

Referring now to FIG. 1a to FIG. 1d there are shown schematic diagrams of reaction chambers within which the preferred embodiments of the present invention may be practiced.

For the preferred embodiments of the present invention, the practice of the present invention begins with providing a suitable reaction chamber within which the improved oxygen Reactive Ion Etch (RIE) plasma of the present invention may be formed. Such chambers are well known in the art. It is preferred that the reaction chamber be able to maintain a temperature in the range of about 100 to about 250 degrees centigrade and a pressure in the range of about 0.1 to about 5 torr. It is within those temperature and pressure ranges that the improved oxygen Reactive Ion Etch (RIE) plasma of the present invention is preferably formed.

Once the reaction chamber has been provided within which the improved oxygen Reactive Ion Etch (RIE) plasma of the present invention may be formed, it is then necessary to provide sources through which a concentration of oxygen and a concentration of moisture may be provided into the reaction chamber. Typically, the concentration of oxygen will be provided into the reaction chamber through an external source of oxygen. This method for providing the concentration of oxygen into the reaction chamber is conventional to the art. Preferably, the concentration of oxygen will be provided into the reaction chamber at about 2000 to about 5000 standard cubic centimeters per minute (sccm) flow.

In addition to providing the concentration of oxygen into the reaction chamber it is also critical for the present invention that a concentration of moisture be provided into the reaction chamber. The present invention provides several embodiments through which the concentration of moisture may be provided into the reaction chamber. The first embodiment follows analogously from the method by which the concentration of oxygen may be provided into the reaction chamber. Within the first embodiment, the concentration of moisture is provided into the reaction chamber through an external source of moisture, preferably at about 50 to about 200 standard cubic centimeters per minute (sccm) moisture flow.

A schematic diagram illustrating a reaction chamber within which moisture is provided in accord with the first preferred embodiment of the present invention is shown in FIG. 1a. Shown in FIG. 1a is a reaction chamber 10 within which reside a radio frequency electrode 16 and a platen 12. Upon the platen 12 is placed a semiconductor substrate 14 upon the surface of which semiconductor substrate 14 resides the oxidized organic residue which is to be removed through the method of the present invention. Sources of oxygen and moisture are introduced into the reaction chamber 10, respectively, through a first entrance port 18 and a second entrance port 20.

The second preferred embodiment through which moisture may be introduced into a reaction chamber to provide the improved oxygen Reactive Ion Etch (RIE) plasma of the present invention employs desorbtion of an amount of moisture sorbed within and upon the surface of an oxidized photoresist residue residing upon the surface of a semiconductor substrate. Within this embodiment, the oxidized photoresist residue represents the oxidized organic residue which is to be removed from the semiconductor substrate through exposure to the improved oxygen Reactive Ion Etch (RIE) plasma of the present invention.

In order for the second preferred embodiment of the present invention to provide a viable method for removing an oxidized photoresist residue from a semiconductor substrate, it is first necessary to sorb upon the surface and within the pores of an oxidized photoresist residue an amount of moisture which when desorbed will provide a sufficient amount of moisture for efficiently forming the improved oxygen Reactive Ion Etch (RIE) plasma of the present invention. Typically, this amount of moisture may be provided within the pores and upon the surface of an oxidized photoresist residue through a deionized water rinse and spin-dry method common to the art of semiconductor manufacturing of a semiconductor substrate upon whose surface is formed the oxidized photoresist residue. When using such a deionized water rinse and spin-dry method, the oxidized photoresist residue residing upon the semiconductor substrate is exposed to deionized water and spun dry until visible traces of water are not present. Under these conditions, it has been found that a sufficient amount of moisture will be sorbed within the pores and upon the surface of the oxidized photoresist residue to provide sufficient moisture which upon desorbtion will provide the reducing species needed for proper performance of the improved oxygen Reactive Ion Etch (RIE) plasma of the present invention.

Figure 1B:
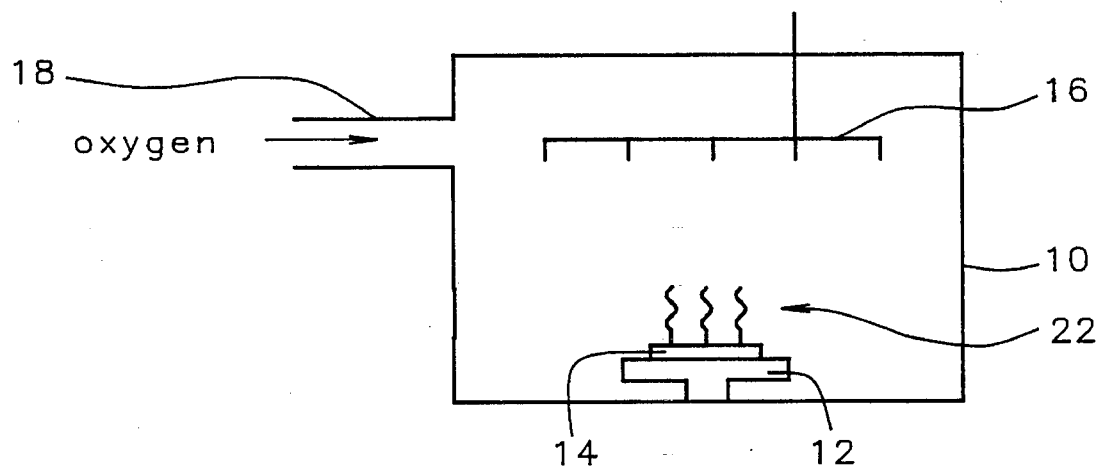

A schematic diagram illustrating a reaction chamber into which moisture is provided through the second embodiment of the present invention is shown in FIG. 1b. FIG. 1b is analogous to FIG. 1a with the exception that the second entrance port 20 of FIG. 1a has been deleted. In addition, there is shown in FIG. 1b the presence of desorbed moisture 22 issuing from the oxidized photoresist residue which resides upon the surface of the semiconductor substrate 14, which semiconductor substrate 14 in turn resides upon the platen 12.

Although the second embodiment of the present invention by which moisture may be introduced into a reaction chamber through desorbtion of moisture from upon the surface and within the pores of an oxidized photoresist residue which resides upon a semiconductor substrate is a viable, convenient and desirable method, the second embodiment may show substantial variations in improved oxygen Reactive Ion Etch (RIE) plasma performance as a consequence of the method by which the oxidized photoresist residue is formed upon a semiconductor substrate. In general, oxidized photoresist residues may be formed upon semiconductor substrates through methods including but not limited to methods employing thermal oxidation sources, methods employing optical radiation oxidation sources and methods by which dopant ions are implanted into photoresist residues to form oxidized photoresist residues. For the present invention, it has been found that the second preferred embodiment of the present invention for providing a concentration of moisture into an oxygen Reactive Ion Etch (RIE) plasma is preferred when the oxidized photoresist residue which resides upon a semiconductor substrate is oxidized through the process of implanting dopant ions into that photoresist residue. The ion implanting process provides sufficient oxidation to a photoresist residue to provide a surface and pore structure to the oxidized photoresist residue from which a sufficient concentration of moisture may be desorbed to efficiently form the improved oxygen Reactive Ion Etch (RIE) plasma of the present invention.

Figure 1C:
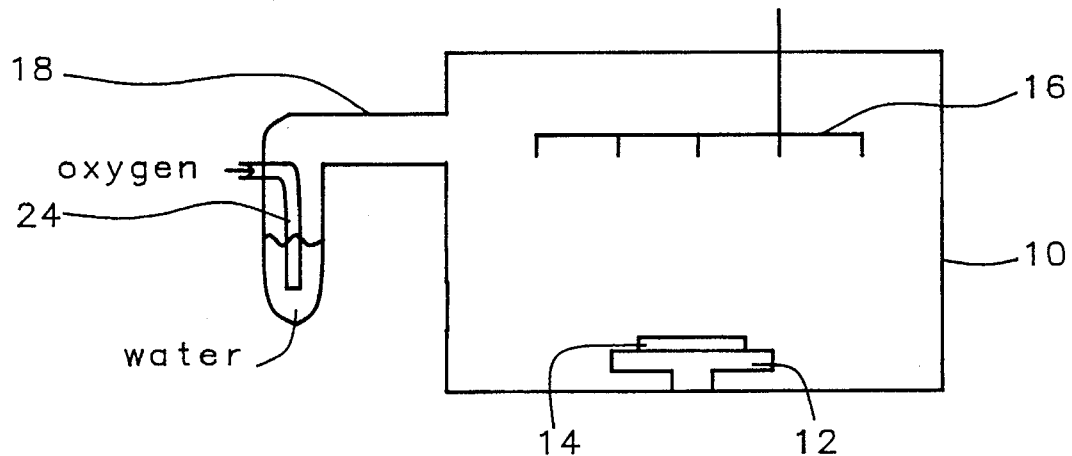

A third preferred embodiment by which a concentration of moisture may be introduced into a reaction chamber to provide the improved oxygen Reactive Ion Etch (RIE) plasma of the present invention is through co-mixing or saturation of the concentration of moisture with the concentration of oxygen that is introduced into the reaction chamber. A fashion by which this embodiment may be accomplished is illustrated in FIG. 1c. Shown in FIG. 1c is the presence of a bubbler 24 attached to a first entrance port 18 through which a concentration of oxygen enters a reaction chamber 10. Contained within the bubbler 24 is water through which at least a portion of the concentration of oxygen entering into the reaction chamber 10 through the first entrance port 18 must flow.

Once the concentration of moisture and the concentration of oxygen have been introduced into a reaction chamber maintained at the preferred temperature and the preferred pressure through an embodiment including but not limited to the three preferred embodiments of the present invention, a source of radio frequency excitation is then provided into the reaction chamber. For any of the preferred embodiments of the present invention, the radio frequency excitation is preferably provided through the radio frequency electrode 16 illustrated in FIG. 1a to FIG. 1c. The preferred level of radio frequency excitation to be provided into the reaction chamber 10 through the radio frequency electrode 16 to form the improved oxygen Reactive Ion Etch (RIE) plasma of the present invention is about 500 to about 1000 watts. Once this level of radio frequency excitation has been introduced into the reaction chamber 10, the etching of the semiconductor substrate 14 upon whose surface resides the oxidized organic residue may proceed. The semiconductor substrate 14 is etched for a time period sufficient to completely remove the oxidized organic residue, such as an oxidized photoresist residue, from the semiconductor substrate 14. The amount of time needed to completely remove the oxidized organic residue will depend upon several factors, including the chemical composition of the oxidized organic residue, the thickness of the oxidized organic residue, and the quantity of oxidized material within the oxidized organic residue.

Upon completion of the etching there has been removed from a semiconductor substrate an oxidized organic residue, such as an oxidized photoresist residue, through an improved oxygen Reactive Ion Etch (RIE) plasma which employs moisture as a source of reducing species to assist in removal of oxidized organic residues such as oxidized photoresist residues. Removal of oxidized organic residues through the method and with the plasma of the present invention provides an effective, safe and manufacturable method in comparison with oxygen plasmas conventional to the art which employ hydrogen or forming gas mixtures to assist in removal of oxidized organic residues such as oxidized photoresist residues from semiconductor substrates.

It is also generally well known in the art that enhanced etching rates may be obtained for Reactive Ion Etch (RIE) plasma methods through providing a magnetic assistance to those Reactive Ion Etch (RIE)plasma methods. Such magnetic assistance is also useful in enhancing the etch rates of the improved oxygen Reactive Ion Etch (RIE) plasmas of the present invention, including but not limited to the plasmas formed through the three preferred embodiments by which moisture may be introduced into those improved oxygen Reactive Ion Etch (RIE) plasmas.

Such magnetic assistance may be provided through methods including but not limited to Magnetically Enhanced Reactive Ion Etch (MERIE) methods whereby magnets are placed within or surrounding a Reactive Ion Etch (RIE) etching chamber and methods which employ other electrical means through which magnetic fields may be formed within Reactive Ion Etch (RIE) etching chambers. When present, the preferred level to which a magnetic field is provided into the improved oxygen Reactive Ion Etch (RIE) plasma of the present invention is about 10 to about 100 gauss. Under these conditions a substantial acceleration is observed in the etching of an oxidized organic residue, such as an oxidized photoresist residue, from the surface of a semiconductor substrate.

Figure 1D:
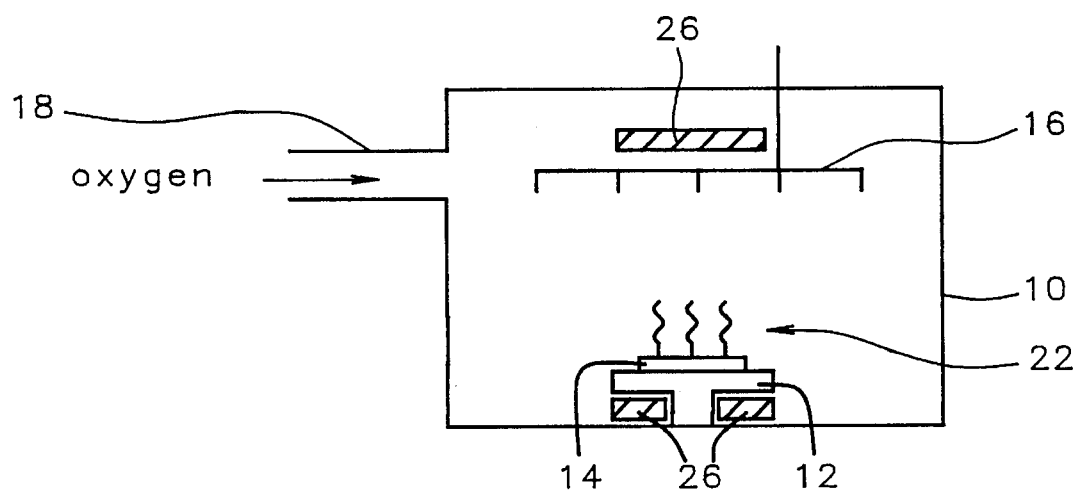

A schematic diagram illustrating placement of magnets within a Reactive Ion Etch (RIE) plasma reaction chamber suitable for the present invention is shown in FIG. 1d. Shown in FIG. 1 d is a two piece magnet 26 individual sections of which are placed beneath the platen 12 and above the radio frequency electrode 16 within a reaction chamber 10.

As will be understood by a person skilled in the art, the foregoing descriptions of the preferred embodiments of the present invention are intended to be illustrative embodiments of the present invention rather than limiting embodiments of the present invention. Revisions to materials and methods by which are formed the preferred embodiments of the improved oxygen Reactive Ion Etch (RIE) plasma of the present invention may be made by a person skilled in the art while remaining within the spirit and scope of the present invention.

What is claimed is:

1. A method for removing an oxidized photoresist residue from a semiconductor substrate comprising:

providing into a reaction chamber a semiconductor substrate, the semiconductor substrate having formed upon its surface an oxidized photoresist residue, the oxidized photoresist residue being formed through implanting dopant ions into a corresponding non-implanted photoresist residue;

providing into the reaction chamber a concentration of oxygen;

providing into the reaction chamber a concentration of water vapor, the concentration of water vapor being introduced into the reaction chamber through desorbtion of an amount of water sorbed within and upon the surface of the oxidized photoresist residue formed upon the semiconductor substrate;

providing a radio frequency excitation to the concentration of oxygen and the concentration of water vapor contained within the reaction chamber, the radio frequency excitation being sufficient to form a plasma; and etching the semiconductor substrate until the oxidized photoresist residue is removed.

2. The method of claim 1 wherein the reaction chamber is maintained at a pressure of 0.1 to 5 torr.

3. The method of claim 1 wherein the reaction chamber is maintained at a temperature of 100 to 250 degrees centigrade.

4. The method of claim 1 wherein the concentration of oxygen is introduced into the reaction chamber through an external source of oxygen at 2000 to 5000 standard cubic centimeters per minute (sccm) flow.

5. The method of claim 1 wherein the amount of water sorbed within and upon the surface of the oxidized photoresist residue residing upon the semiconductor substrate is provided through a spin-dry process whereby the oxidized photoresist residue residing upon the semiconductor substrate is exposed to water and spun dry.

6. The method of claim 1 wherein the radio frequency excitation is provided at 500 to 1000 watts.

7. The method of claim 1 additionally comprising a magnetic assistance to the radio frequency excitation.

8. The method of claim 7 wherein the magnetic assistance is provided at 10 to 100 gauss.

9. A plasma for use in removing an oxidized photoresist residue from a semiconductor substrate comprising:

a concentration of oxygen contained within a reaction chamber;

a concentration of water vapor contained within the reaction chamber, the concentration of water vapor being introduced into the reaction chamber through desorbtion of an amount of water sorbed within and upon the surface of an oxidized photoresist residue formed upon the surface of a semiconductor substrate when the semiconductor substrate is provided into the reaction chamber, the oxidized photoresist residue being formed through implanting dopant ions into a corresponding non-implanted photoresist residue formed upon the semiconductor substrate; and a radio frequency excitation provided to the concentration of oxygen and the concentration of water vapor, the radio frequency excitation being sufficient to form a plasma.

10. The plasma of claim 9 wherein the reaction chamber is maintained at a pressure of 0.1 to 5 torr and a temperature of about 100 to about 250 degrees centigrade.

11. The plasma of claim 9 wherein the concentration of oxygen is introduced into the reaction chamber through an external source of oxygen at 2000 to 5000 standard cubic centimeters per minute (sccm) flow.

12. The plasma of claim 9 wherein the amount of water sorbed within and upon the surface of the oxidized photoresist residue residing upon the semiconductor substrate is provided through a spin-dry process where the oxidized photoresist residue residing upon the semiconductor substrate is exposed to water and spun dry.

13. The plasma of claim 9 wherein the radio frequency excitation is provided at 500 to 1000 watts.

14. The plasma of claim 9 additionally comprising a magnetic assistance to the plasma, the magnetic assistance being provided at 10 to 100 gauss.

* * * * *